United States Patent
Tomine et al.

(10) Patent No.: US 8,234,013 B2
(45) Date of Patent: Jul. 31, 2012

(54) SEMICONDUCTOR MANUFACTURING SYSTEM AND METHOD FOR WASTE LIQUID COLLECTION

(75) Inventors: Tetsu Tomine, Fujimi-cho (JP); Atsushi Osada, Kai (JP)

(73) Assignee: Seiko Epson Corporation, Tokyo (JP)

(*) Notice: Subject to any disclaimer, the term of this patent is extended or adjusted under 35 U.S.C. 154(b) by 85 days.

(21) Appl. No.: 12/940,494

(22) Filed: Nov. 5, 2010

(65) Prior Publication Data

US 2011/0046797 A1 Feb. 24, 2011

Related U.S. Application Data

(62) Division of application No. 12/033,421, filed on Feb. 19, 2008, now Pat. No. 7,853,347.

(30) Foreign Application Priority Data

Feb. 27, 2007 (JP) .................. 2007-046553

(51) Int. Cl.
*G06F 19/00* (2011.01)
(52) U.S. Cl. ........ 700/282; 700/202; 700/108; 700/121; 134/56 R; 134/58 R
(58) Field of Classification Search .................. 700/20, 700/108, 121, 282; 347/56 R, 58 R
See application file for complete search history.

(56) References Cited

U.S. PATENT DOCUMENTS

| | | | | |
|---|---|---|---|---|
| 5,542,441 A * | 8/1996 | Mohindra et al. | ............ | 134/95.2 |
| 5,804,516 A * | 9/1998 | Hsu et al. | .................... | 438/745 |
| 6,293,288 B2 * | 9/2001 | Shindo et al. | ............... | 134/57 R |
| 6,464,799 B1 * | 10/2002 | Lerner et al. | .................... | 134/18 |
| 6,889,105 B2 * | 5/2005 | Mukuta et al. | ................ | 700/100 |
| 2005/0068383 A1 * | 3/2005 | Matsuda et al. | ................ | 347/85 |
| 2005/0109374 A1 * | 5/2005 | Letessier et al. | ............ | 134/22.1 |
| 2008/0208386 A1 * | 8/2008 | Tomine et al. | ................ | 700/121 |
| 2008/0262655 A1 * | 10/2008 | Smith et al. | ................... | 700/247 |

FOREIGN PATENT DOCUMENTS

JP A-2006-222264 8/2006

* cited by examiner

*Primary Examiner* — Michael D Masinick
(74) *Attorney, Agent, or Firm* — Oliff & Berridge, PLC (57) ABSTRACT

A semiconductor manufacturing system includes a semiconductor manufacturing apparatus, a first controller for controlling the semiconductor manufacturing apparatus, an auxiliary machine for the semiconductor manufacturing apparatus, a second controller for controlling the auxiliary machine, and a third controller for electrically coupling the first and second controllers. The second controller outputs an auxiliary machine-in-operation signal to the third controller when the auxiliary machine is operating, outputs an auxiliary machine-stopping signal to the third controller when the auxiliary machine is stopping, and operates or stops the auxiliary machine according to an instruction signal received from the third controller. The first controller receives the auxiliary machine-in-operation signal or the auxiliary machine-stopping signal via the third controller, and keeps the semiconductor manufacturing apparatus in operation or on standby when the first controller is receiving the auxiliary machine-in-operation signal. The third controller stops the auxiliary machine when the third controller detects that the semiconductor manufacturing apparatus is on standby, and outputs the auxiliary machine-in-operation signal, instead of the auxiliary machine-stopping signal received from the second controller, to the first controller.

3 Claims, 12 Drawing Sheets

SEMICONDUCTOR MANUFACTURING SYSTEM AND METHOD FOR WASTE LIQUID COLLECTION

This application is a divisional of U.S. patent application Ser. No. 12/033,421 filed on Feb. 19, 2008, which claims priority to Japanese Patent Application No. 2007-046553 filed on Feb. 27, 2007. The disclosure of the prior application is hereby incorporated by reference herein in its entirety.

BACKGROUND

1. Technical Field

The present invention relates to a semiconductor manufacturing system in which a semiconductor manufacturing apparatus is kept on standby or in operation when an auxiliary machine is operating, a controller, and a semiconductor manufacturing system control method. In particular, the invention relates to a semiconductor manufacturing system and a controller that each keeps the auxiliary machine stopped for energy saving purposes when the semiconductor manufacturing apparatus is on standby. Also, the invention relates to a semiconductor manufacturing system, a controller, and a method for collecting a processing liquid that has become a waste liquid.

2. Related Art

Figure 11:
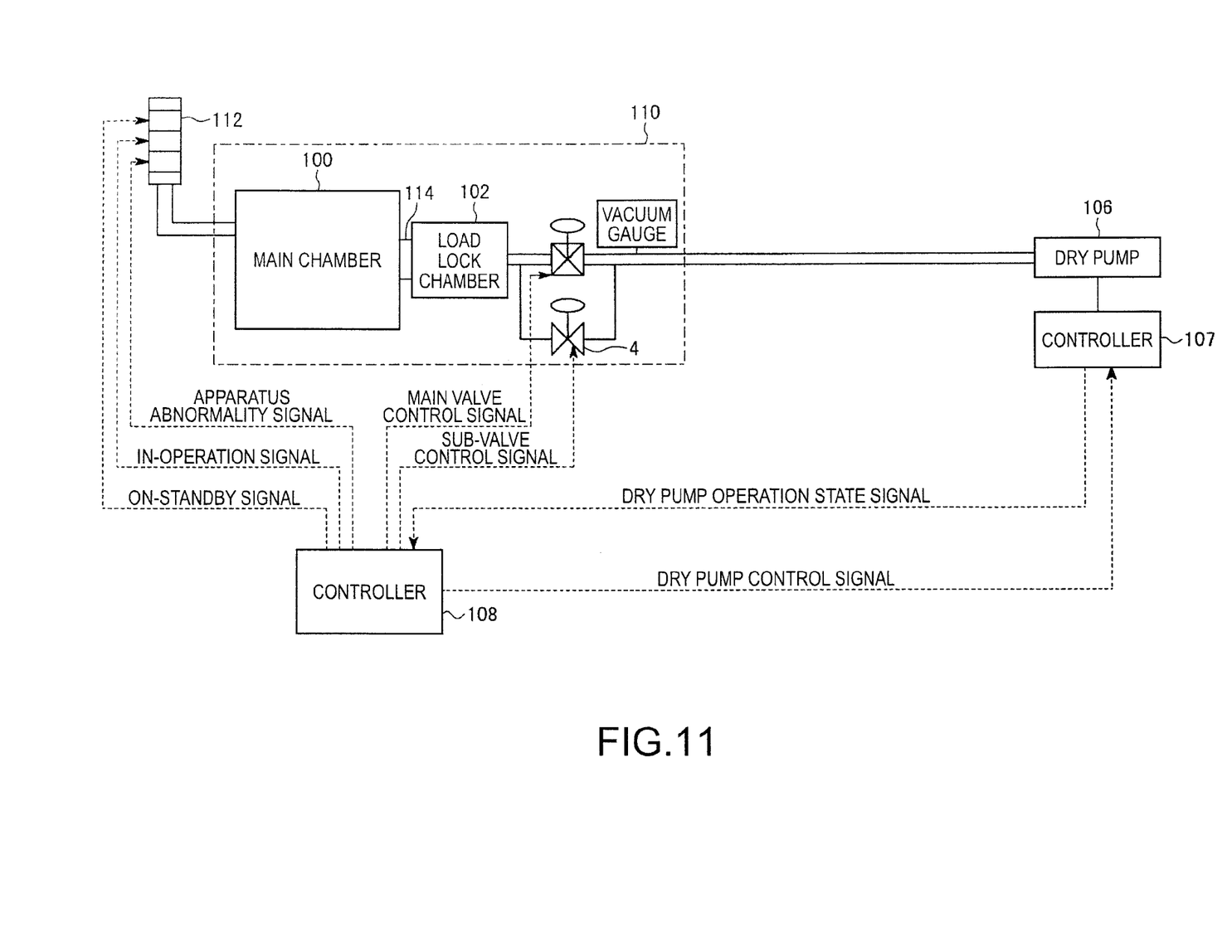
FIG. 11 is a diagram showing a first example configuration of a related art semiconductor manufacturing system.

FIG. 11 is a diagram showing a first example configuration of a related art semiconductor manufacturing system. This semiconductor manufacturing system includes a semiconductor manufacturing apparatus 110 and a dry pump 106 as an auxiliary machine. The semiconductor manufacturing apparatus 110 includes a main chamber 100 for processing a semiconductor substrate using a processing gas, and a load lock chamber 102 mounted on the main chamber 100 with a gate valve 114 therebetween.

A controller 107 for the dry pump 106 outputs a dry pump operation state signal indicating whether the dry pump 106 is operating or stopping, to a controller 108 for the semiconductor manufacturing apparatus 110. The controller 108 outputs a dry pump control signal for operating or stopping the dry pump 106, to the controller 107. The controller 107 controls the dry pump 106 according to the dry pump control signal.

The controller 108 for the semiconductor manufacturing apparatus 110 puts the semiconductor manufacturing apparatus 110 into operation or on standby if a dry pump operation state signal indicates that the dry pump 106 is operating. If the dry pump operation state signal indicates that the dry pump is stopping when the semiconductor manufacturing apparatus 110 is in operation or on standby, the controller 108 determines that an abnormality has occurred in the dry pump 106 and outputs an apparatus abnormality signal to a display 112 so that the display 112 displays a message to that effect, as well as prevents the semiconductor manufacturing apparatus 110 from operating.

Figure 12:
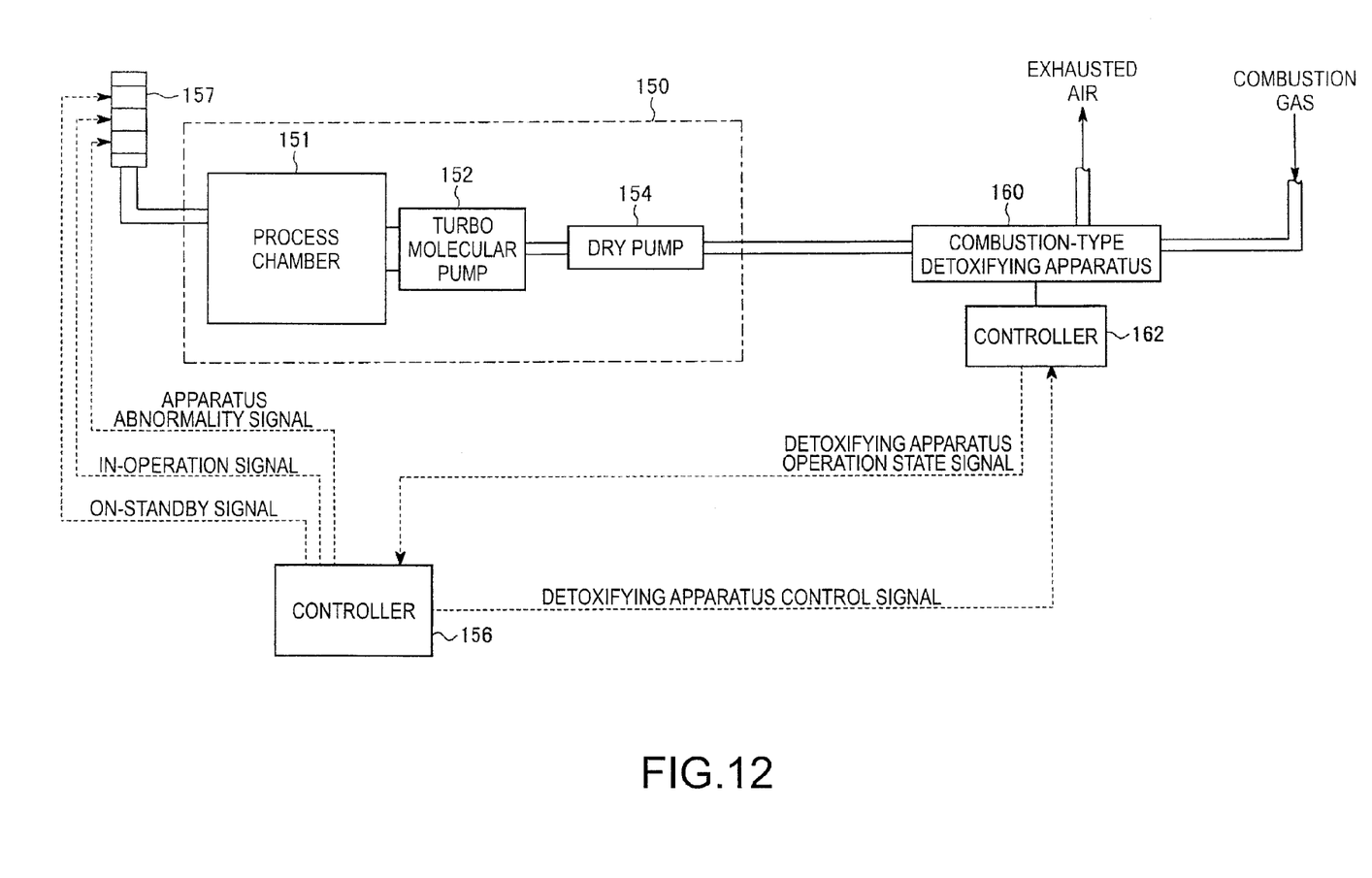
FIG. 12 is a diagram showing a second example configuration of the related art semiconductor manufacturing system.

FIG. 12 is a diagram showing a second example configuration of the related art semiconductor manufacturing system. This semiconductor manufacturing system includes a semiconductor manufacturing apparatus 150 and a combustion-type detoxifying apparatus 160 as an auxiliary machine. The semiconductor manufacturing apparatus 150 includes a process chamber 151 for processing a semiconductor substrate using a processing gas, and a turbo molecular pump 152 and a dry pump 154 that are sequentially coupled to the process chamber 151. Air exhausted from the dry pump 154 is detoxified by the combustion-type detoxifying apparatus 160 and then discharged to outside.

A controller 162 for the combustion-type detoxifying apparatus 160 outputs a detoxifying apparatus operation state signal indicating whether the combustion-type detoxifying apparatus 160 is operating or stopping, to a controller 156 for the semiconductor manufacturing apparatus 150. The controller 156 outputs a detoxifying apparatus control signal for operating or stopping the combustion-type detoxifying apparatus 160, to the controller 162. The controller 162 controls the combustion-type detoxifying apparatus 160 according to the detoxifying apparatus operation state signal.

The controller 156 for the semiconductor manufacturing apparatus 150 puts the semiconductor manufacturing apparatus 150 into operation or on standby if the detoxifying apparatus operation state signal indicates that the combustion-type detoxifying apparatus 160 is operating. If the detoxifying apparatus operation state signal indicates that the combustion-type detoxifying apparatus 160 is stopping, when the semiconductor manufacturing apparatus 150 is in operation or on standby, the controller 156 determines that an abnormality has occurred in the combustion-type detoxifying apparatus 160 and outputs an apparatus abnormality signal to a display 157 so that the display 112 displays a message to that effect, as well as prevents the semiconductor manufacturing apparatus 150 from operating.

Figure 13:
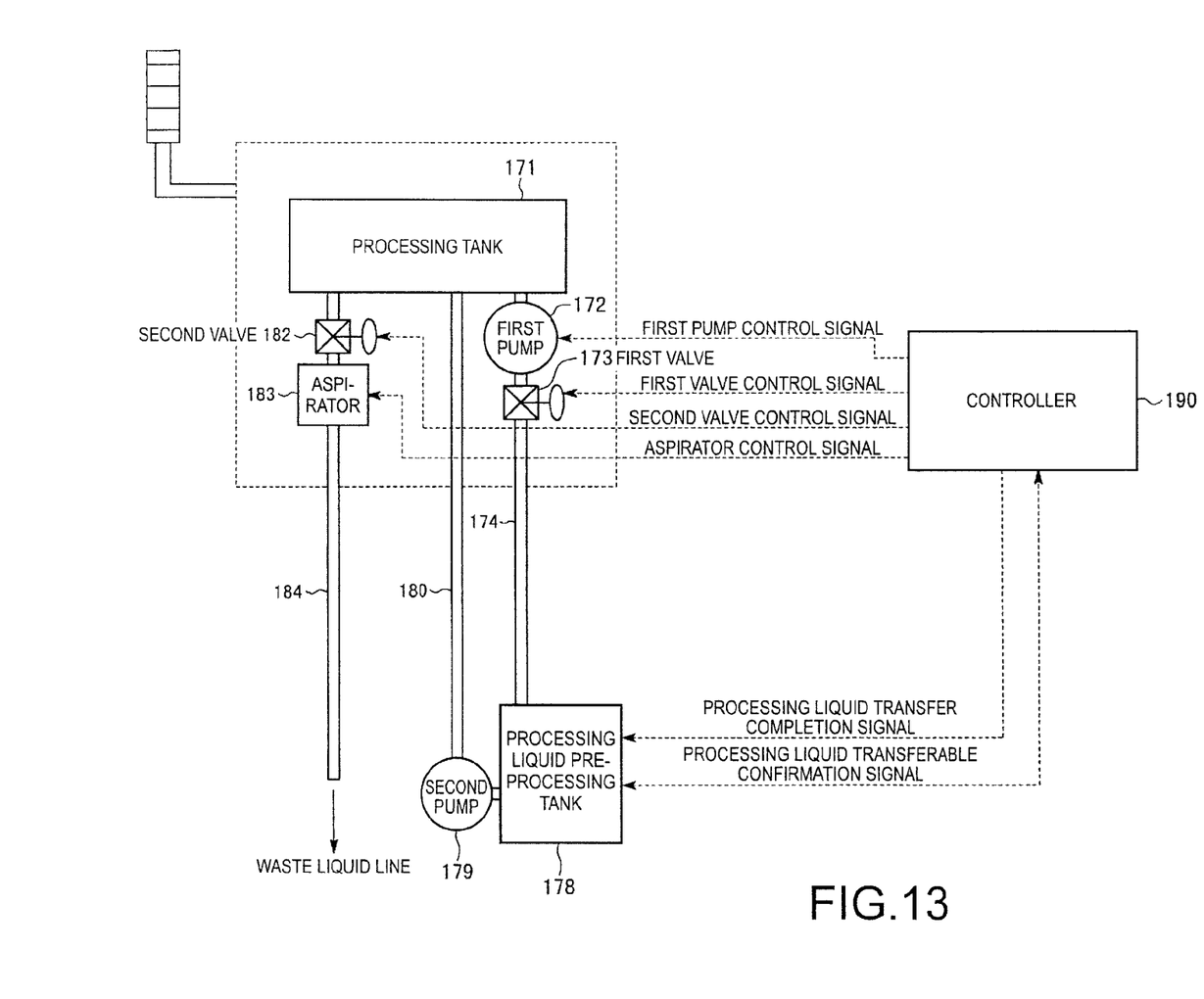
FIG. 13 is a diagram showing a third example configuration of the related art semiconductor manufacturing system.

FIG. 13 is a diagram showing a third example configuration of the related art semiconductor manufacturing system. This semiconductor manufacturing system is a system for processing a semiconductor substrate using a processing liquid contained in a processing tank 171. The processing liquid contained in the processing tank 117 is reused by a given number of times by being subjected heating and ingredient preparation (hereafter referred to as "preprocessing") in a processing liquid preprocessing tank 178. The processing liquid that has been reused by the given number of times is discarded into a waste liquid line.

The processing liquid contained in the processing tank 171 is transferred to the processing liquid preprocessing tank 178 via piping 174, and the processing liquid preprocessed in the processing liquid preprocessing tank 178 is returned to the processing tank 171 via piping 180. A first pump 172 and a first valve 173 are mounted on the piping 174, and a second pump 179 is mounted on the piping 180. The processing liquid discarded from the processing tank 171 is discarded into the water liquid line via piping 184. A second valve 182 and an aspirator 183 for diluting a processing liquid are mounted on the piping 184. The first pump 172, the second pump 179, the first valve 173, the second valve 182, and the aspirator 183 are controlled by a controller 190.

Incidentally, energy savings of semiconductor manufacturing systems are currently being promoted. For example, disclosed in JP-A-2006-222264 (FIG. 2) is a semiconductor manufacturing apparatus that performs energy-saving control when the apparatus is put on standby over an extended period of time. Also, collection and reuse of a processing liquid that has become a waste liquid is being promoted.

In the above-described first and second examples of the relate art semiconductor manufacturing system, the semiconductor manufacturing apparatus is on standby or in operation when the auxiliary machine is operating. In other words, the auxiliary machine is operating even when the semiconductor manufacturing apparatus is on standby. In order to promote energy savings, it is preferable to stop the auxiliary machine when the semiconductor manufacturing apparatus is on standby. However, modifications to the semiconductor manufacturing apparatus and the auxiliary machine involve a modification to each control software. If a modification is made to each control software, much effort must be expended to prevent a bug from occurring.

Also, if a processing liquid that has become a waste liquid is collected and reused, it is preferable to collect the processing liquid without diluting it. However, in the above-described third example of the related art semiconductor manufacturing system, the processing liquid that has become a waste liquid is diluted when it is discharged from the processing tank. In order not to dilute the waste liquid, a modification must be made to the control software for the controller. If such a modification is made, much effort must be expended to prevent a bug from occurring.

SUMMARY

An advantage of the invention is to provide a semiconductor manufacturing system and a controller, in a semiconductor manufacturing system in which a semiconductor manufacturing apparatus is put on standby or into operation when an auxiliary machine is operating, each of which keeps the auxiliary machine stopped for energy-saving purposes when the semiconductor manufacturing apparatus is on standby, without having to modify the controllers for the semiconductor manufacturing apparatus and the auxiliary machine. Another advantage of the invention is to provide a semiconductor manufacturing system, a controller, and a processing liquid collection method, in a semiconductor manufacturing system in which when a processing liquid that has become a waste liquid is discharged from a processing tank, the processing liquid is diluted, each of which collects the processing liquid without diluting it even if no modification is made to the controller.

According to a first aspect of the invention, a semiconductor manufacturing system includes a semiconductor manufacturing apparatus, a first controller for controlling the semiconductor manufacturing apparatus, an auxiliary machine for the semiconductor manufacturing apparatus, a second controller for controlling the auxiliary machine, and a third controller for electrically coupling the first and second controllers. The second controller outputs an auxiliary machine-in-operation signal to the third controller when the auxiliary machine is operating, outputs an auxiliary machine-stopping signal to the third controller when the auxiliary machine is stopping, and operates or stops the auxiliary machine according to an instruction signal received from the third controller. The first controller receives the auxiliary machine-in-operation signal or the auxiliary machine-stopping signal via the third controller, and keeps the semiconductor manufacturing apparatus in operation or on standby when the first controller is receiving the auxiliary machine-in-operation signal. The third controller stops the auxiliary machine when the third controller detects that the semiconductor manufacturing apparatus is on standby, and outputs the auxiliary machine-in-operation signal, instead of the auxiliary machine-stopping signal received from the second controller, to the first controller.

In a related art semiconductor manufacturing system including the semiconductor manufacturing apparatus, the first controller, the auxiliary machine, and the second controller, the auxiliary machine operates even when the semiconductor manufacturing apparatus is on standby. Addition of the third controller to such a related art semiconductor manufacturing system allows the related art system to serve as the semiconductor manufacturing system according to the first aspect of the invention without having to modify the first and second controllers. Thus, the auxiliary machine is kept stopped when the semiconductor manufacturing apparatus is on standby.

The semiconductor manufacturing system according to the first aspect of the invention preferably further includes a display for, if the display receives an apparatus-in-operation signal indicating that the semiconductor manufacturing apparatus is operating, indicating that the semiconductor manufacturing apparatus is operating and for, if the display receives an apparatus-on-standby signal indicating that the semiconductor manufacturing apparatus is on standby, indicating that the semiconductor manufacturing apparatus is on standby. The first controller preferably outputs the apparatus in-operation signal or the apparatus on-standby signal to the display and the third controller. If the third controller receives the apparatus on-standby signal, the third controller preferably detects that the semiconductor manufacturing apparatus is on standby.

The semiconductor manufacturing apparatus is, for example, an apparatus for performing processing in a vacuum chamber and the auxiliary machine is, for example, a vacuum pump for exhausting air from the vacuum chamber. In this case, the semiconductor manufacturing system may include an exhaust pipe for coupling the semiconductor manufacturing apparatus and the vacuum pump and a first valve that is provided on the exhaust pipe and is closed when the semiconductor manufacturing apparatus is on standby and is opened when the semiconductor manufacturing apparatus is operating. When the first valve is closed, the third controller may determine that the semiconductor manufacturing apparatus is on standby. Also in this case, the semiconductor manufacturing system may include a second valve that is provided between the first valve and the vacuum pump on the exhaust pipe and is opened or closed according to a control signal outputted from the third controller, and a vacuum gauge for measuring a pressure of the pipe in a position between the first and second valves. The third controller may close the second valve to stop the auxiliary machine when the semiconductor manufacturing apparatus is on standby and open it when the auxiliary machine is operating. If the pressure of the exhaust pipe measured by the vacuum gauge becomes a reference value or higher after the third controller determines that the semiconductor manufacturing apparatus is on standby and then stops the auxiliary machine, the third controller may operate the vacuum pump via the second controller and open the second valve.

The semiconductor manufacturing apparatus is, for example, an apparatus for performing processing by introducing a processing gas into a vacuum chamber, and the auxiliary machine is, for example, a detoxifying apparatus for detoxifying air exhausted from the vacuum chamber.

A semiconductor manufacturing system according to a second aspect of the invention includes a processing tank for containing a processing liquid for processing a semiconductor substrate, a preprocessing tank for preprocessing the processing liquid, first piping for transferring the processing liquid contained in the processing tank to the preprocessing tank, second piping for returning the processing liquid preprocessed in the preprocessing tank to the processing tank, a first valve provided on the first piping, a waste liquid tank for collecting the processing liquid that has become a waste liquid, a second valve provided downstream of the first valve on the first piping, third piping for coupling a portion of the first piping in a position between the first and second valves and the waste liquid tank, a third valve provided on the third piping, a first controller for opening the first valve in preprocessing tank introduction mode in which the processing liquid contained in the processing tank is introduced into the preprocessing tank, and a second controller for controlling the second and third valves. If the processing liquid contained in the processing tank is collected into the waste liquid tank, the second controller closes the second valve and opens the third valve, and outputs, to first the control unit, a preprocessing tank introduction shift signal for instructing a shift to the preprocessing tank introduction mode. Upon receipt of the preprocessing tank introduction shift signal from the second controller, the first controller opens the first valve.

This semiconductor manufacturing system is realized by adding the third piping, the second and third valves, the waste liquid tank, and the second controller to a related art semiconductor manufacturing system including the processing tank, the preprocessing tank, the first controller, the first and second piping, and the first valve. The above-described semiconductor manufacturing system allows collection of the processing liquid from the transfer system for transferring the processing liquid to the preprocessing tank, that is, from the first piping without diluting the processing liquid. As a result, the processing liquid that has become a waste liquid is collected without having to be diluted even if no modification is made to the first controller.

According to a third aspect of the invention, a controller for electrically coupling a first control unit for controlling a semiconductor manufacturing apparatus and a second control unit for controlling an auxiliary machine for the semiconductor manufacturing apparatus includes a reception unit for receiving an auxiliary machine-in-operation signal indicating that the auxiliary machine is operating and an auxiliary machine-stopping signal indicating that the auxiliary machine is stopping, both of which are signals outputted from the second control unit, an output unit for outputting the auxiliary machine-in-operation signal or the auxiliary machine-stopping signal to the first control unit, and a calculation control unit for controlling the auxiliary machine via the second control unit. If the calculation control unit detects that the semiconductor manufacturing apparatus is on standby, the calculation control unit stops the auxiliary machine and outputs the auxiliary machine-in-operation signal, instead of the auxiliary machine-stopping signal received from the second control unit, from the output unit to the first control unit.

A controller according to a fourth aspect of the invention is used in a semiconductor manufacturing system including a processing tank for containing a processing liquid for processing a semiconductor substrate, a preprocessing tank for preprocessing the processing liquid, first piping for transferring the processing liquid contained in the processing tank to the preprocessing tank, second piping for returning the processing liquid preprocessed in the preprocessing tank to the processing tank, a first valve provided on the first piping, a waste liquid tank for collecting the processing liquid that has become a waste liquid, a second valve provided downstream of the first valve on the first piping, third piping for coupling a portion of the first piping in a position between the first and second valves and the waste liquid tank, a third valve provided on the third piping, and a control unit for opening the first valve in preprocessing tank introduction mode in which the processing liquid contained in the processing tank is introduced into the preprocessing tank. The controller controls the second and third valves. If the processing liquid contained in the processing tank is collected into the waste liquid tank, the controller closes the second valve and opens the third valve, and outputs, to the control unit, a preprocessing tank introduction shift signal for instructing a shift to the preprocessing tank introduction mode.

A method for controlling a semiconductor manufacturing system according to a fifth aspect of the invention is a method for controlling a semiconductor manufacturing system including a semiconductor manufacturing apparatus, an auxiliary machine for the semiconductor manufacturing apparatus, a first controller for controlling the semiconductor manufacturing apparatus and outputting an instruction signal for instructing an operation of the auxiliary machine, and a second controller for controlling the auxiliary machine according to the instruction signal and outputting, to the first controller, an auxiliary machine-in-operation signal if the auxiliary machine is operating and an auxiliary machine-stopping signal if the auxiliary machine is stopping. The first controller keeps the semiconductor manufacturing apparatus in operation or on standby when the first controller is receiving the auxiliary machine-in-operation signal. The method includes electrically coupling the first and second controllers via a third controller, causing the second controller to output the auxiliary machine-in-operation or the auxiliary machine-stopping signal to the third controller, causing the first controller to output the instruction signal to the third controller, and causing the third controller to control the auxiliary machine via the second controller and, if the third controller detects that the semiconductor manufacturing apparatus is on standby, causing the third controller to stop the auxiliary machine and output the auxiliary machine-in-operation signal, instead of the auxiliary machine-stopping signal received from the second controller, to the first controller.

A processing liquid collection method according to a sixth aspect of the invention is a method for collecting a processing liquid that has become a waste liquid, from a semiconductor manufacturing system including a processing tank for containing the processing liquid for processing a semiconductor substrate, a preprocessing tank for preprocessing the processing liquid, first piping for introducing the processing liquid contained in the processing tank into the preprocessing tank, second piping for returning the processing liquid preprocessed in the preprocessing tank to the processing tank, a first valve provided on the first piping, and a control unit for opening the first valve if the control unit receives a preprocessing tank introduction shift signal for instructing introduction of the processing liquid contained in the processing tank into the preprocessing tank. The method includes providing a second valve downstream of the first valve on the first piping, coupling a waste liquid tank for collecting the processing liquid that has become a waste liquid, and a portion of the first piping in a position between the first and second valves using third piping, providing a third valve on the third piping, controlling the second and third valves using a controller, and if the processing liquid contained in the processing tank is collected into the waste liquid tank, closing the second valve and opening the third valve, and then outputting the preprocessing tank introduction shift signal to the control unit so as to open the first valve.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
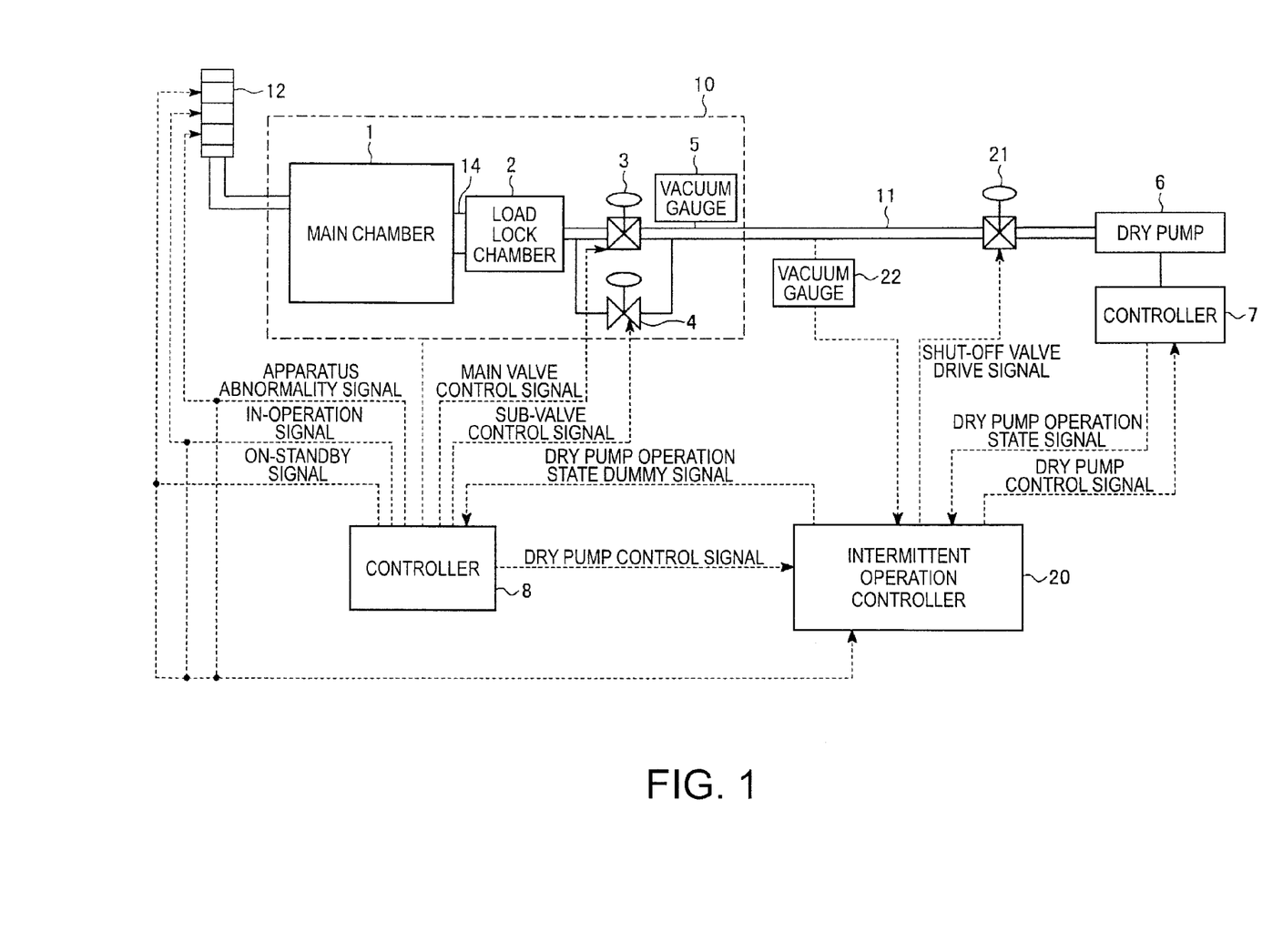
FIG. 1 is a diagram showing a configuration of a semiconductor manufacturing system according to a first aspect of the invention.

Embodiments of the invention will now be described with reference to the accompanying drawings. FIG. 1 is a diagram showing a configuration of a semiconductor manufacturing system according to a first embodiment of the invention. This semiconductor manufacturing system includes a semiconductor manufacturing apparatus 10, a dry pump 6 as an auxiliary machine, a controller 8 for the semiconductor manufacturing apparatus 10, a controller 7 for the dry pump 6, a display 12, and an intermittent operation controller 20. The intermittent operation controller 20 electrically couples the controllers 7 and 8. The semiconductor manufacturing system shown in this diagram is realized, for example, by adding the intermittent operation controller 20 to the related art semiconductor manufacturing system shown in FIG. 11.

The semiconductor manufacturing apparatus 110 includes the main chamber 100 for processing a semiconductor substrate using a processing gas, and the load lock chamber 102 mounted on the main chamber 100 with the gate valve 114 between. The load lock chamber 2 is coupled to the dry pump 6 via vacuum piping 11.

Mounted on the vacuum piping 11 are a main valve 3, a sub-valve 4, and a shut-off valve 21. The main valve 3 and the sub-valve 4 are provided in parallel. The shut-off valve 21 is mounted downstream of the main valve 3 and the sub-valve 4.

Also mounted on the vacuum piping 11 are vacuum gauges 5 and 22. The vacuum gauge 5 measures the degree of vacuum of a portion of the vacuum piping 11 near the main valve 3 between the main valve 3 and shut-off valve 21. The vacuum gauge 22 measures the degree of vacuum of a portion of the vacuum piping 11 near the shut-off valve 21 between the main valve 3 and shut-off valve 21.

The controller 8 controls the semiconductor manufacturing apparatus 10 as well as outputs a dry pump control signal for operating or stopping the dry pump 6 to the intermittent operation controller 20. The controller 8 receives a dry pump operation state dummy signal from the intermittent operation controller 20 and controls the open/close of the main valve 3 and the sub-valve 4.

If the dry pump operation state dummy signal indicates that the dry pump 6 is operating, the controller 8 puts the semiconductor manufacturing apparatus 10 into operation or on standby and outputs an on-standby signal or an in-operation signal to the display 12 and the intermittent operation controller 20.

If the drip pump drive state dummy signal indicates that the dry pump 6 is stopping, the controller 8 moves to emergency mode and transmits an apparatus abnormality signal to the display 12 so as to prevent the semiconductor manufacturing apparatus 10 from operating.

According to the received signal, the display 12 indicates that the semiconductor manufacturing apparatus 10 is on standby, in operation, or under an abnormal condition.

The controller 7 controls the dry pump 6. Also, the controller 7 outputs a dry pump operation state signal indicating whether or not the dry pump 6 is operating, to the intermittent operation controller 20. Further, the controller 7 puts the dry pump 6 into operation or on standby according to a dry pump control signal outputted from the intermittent operation controller 20.

Figure 2:
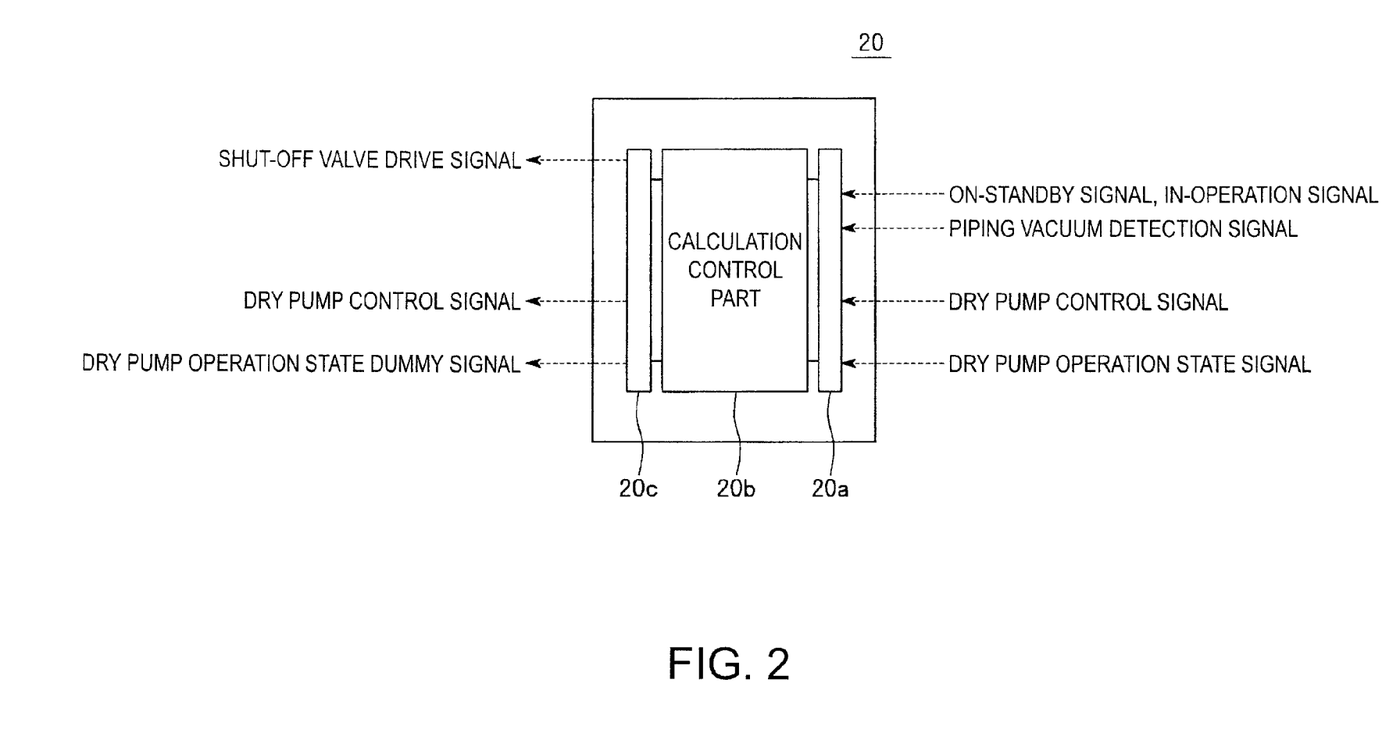
FIG. 2 is a diagram showing a configuration of an intermittent operation controller 20.

FIG. 2 is a diagram showing a configuration of the intermittent operation controller 20. As shown in this diagram, the intermittent operation controller 20 includes a signal IN port 20a, a calculation control part 20b, and a signal OUT port 20c. As shown in this diagram and FIG. 1, the signal IN port 20a receives an on-standby signal or an in-operation signal and a dry pump control signal from the controller 8 for the semiconductor manufacturing apparatus 10, a drip pump operation state signal from the controller 7 for the dry pump 6, and a piping vacuum detection signal that is a value measured by the vacuum gauge 22. The signal OUT port 20c outputs a signal for driving the shut-off valve 21 to the shut-off valve 21, a dry pump control signal to the controller 7, and a dry pump operation state dummy signal to the controller 8. The dry pump operation state dummy signal is a signal identical to a dry pump operation state signal except for a case to be discussed later.

If the controller 8 is outputting an on-standby signal, the calculation control part 20b outputs a dry pump control signal for stopping the dry pump 6 from the signal OUT port 20c to the controller 7 even if a dry pump control signal received from the controller 8 is a signal for operating the dry pump 6. Thus, the dry pump operation state signal received from the controller 7 comes to indicate that the dry pump 6 is stopping, while the calculation control part 20b outputs a dry pump operation dummy signal indicating that the dry pump is operating, to the controller 8.

Figure 3:
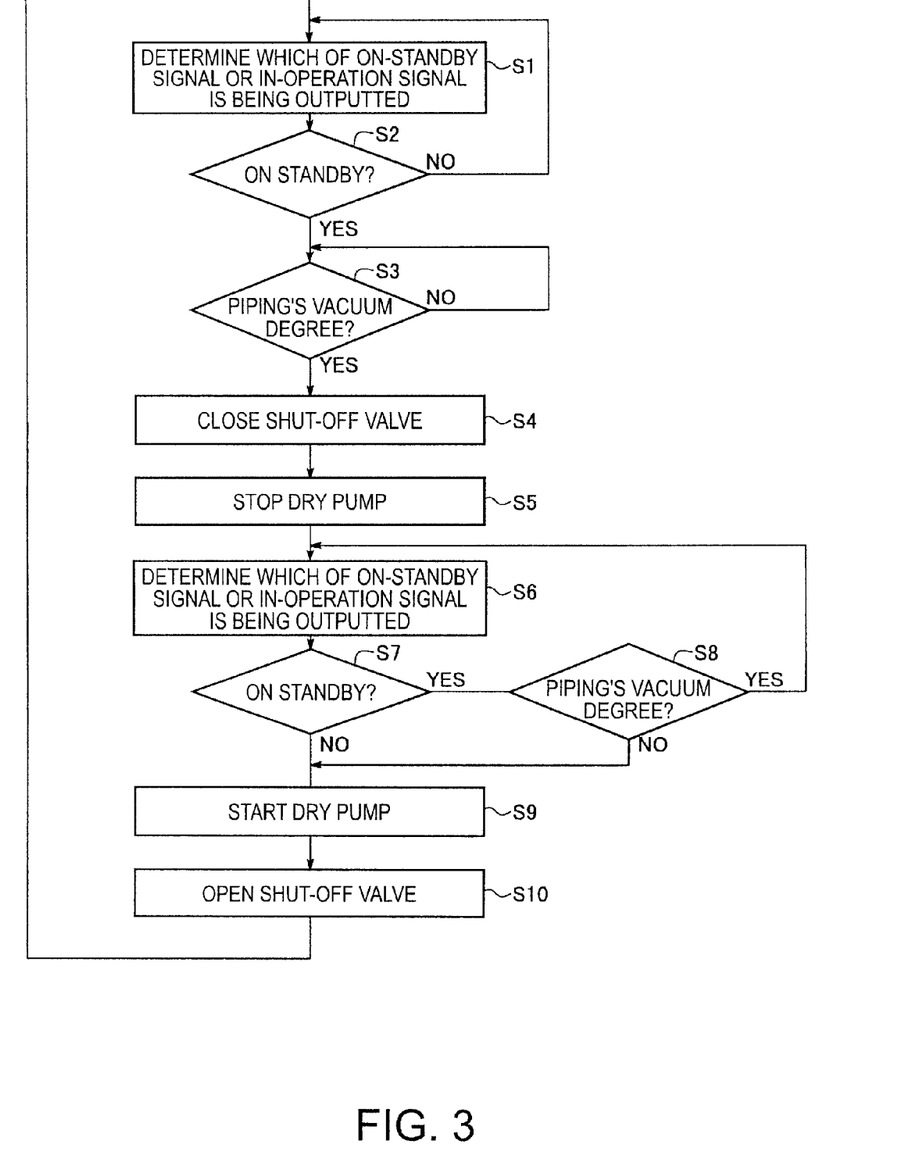
FIG. 3 is a flowchart showing an example of control performed by the intermittent operation controller 20.

FIG. 3 is a flowchart showing an example of control performed by the intermittent operation controller 20. The control shown in this example is for energy-saving purposes. First, the intermittent operation controller 20 determines which of an on-standby signal and an in-operation signal is being outputted from the controller 8 (S1). If an on-standby signal is being outputted, that is, if the semiconductor manufacturing apparatus 10 is on standby (S2: YES), the intermittent operation controller 20 confirms that a value measured by the vacuum gate 22, that is, the degree of vacuum of the vacuum piping 11 is equal to or lower than a reference value (S3: YES), and then closes the shut-off valve 21 (S4) and then stops the dry pump 6 (S5).

Subsequently, the intermittent operation controller 20 continues to determine which of an on-standby signal and an in-operation signal is being outputted from the controller 8 (S6). If the on-standby signal is changed to an in-operation signal (S7: NO), the intermittent operation controller 20 starts the dry pump 6 and then opens the shut-off valve 21 (S10).

Also, when the controller 8 is outputting the on-standby signal (S7: YES), the intermittent operation controller 20 continues to confirm that a value measured by the vacuum gauge 22, that is, the degree of vacuum of the vacuum piping 11 is equal to or lower than the reference value (S8: YES). If the degree of vacuum of the vacuum piping 11 exceeds the reference value, the intermittent operation controller 20 starts the dry pump 6 (S9) and then opens the shut-off valve 21 (S10).

As described above, according to the first embodiment, the controller 8 for the semiconductor manufacturing apparatus 10 and the controller 7 for the dry pump 6 as an auxiliary machine are electrically coupled via the intermittent operation controller 20. Thus, even if the controller 8 outputs a dry pump control signal for operating the dry pump 6 when the semiconductor manufacturing apparatus 10 is on standby, the intermittent operation controller 20 changes the dry pump control signal to a signal for stopping the dry pump 6 and outputs the changed signal to the controller 7. Thus, the dry pump operation state signal outputted from the controller 7 comes to indicate that the dry pump is stopping, while the intermittent operation controller 20 outputs a dry pump operation state dummy signal indicating that the dry pump 6 is operating, to the controller 8.

As a result, even if no modification is made to the controllers 7 and 8, the dry pump 6 is kept stopped when the semiconductor manufacturing apparatus 10 is on standby.

Figure 4:
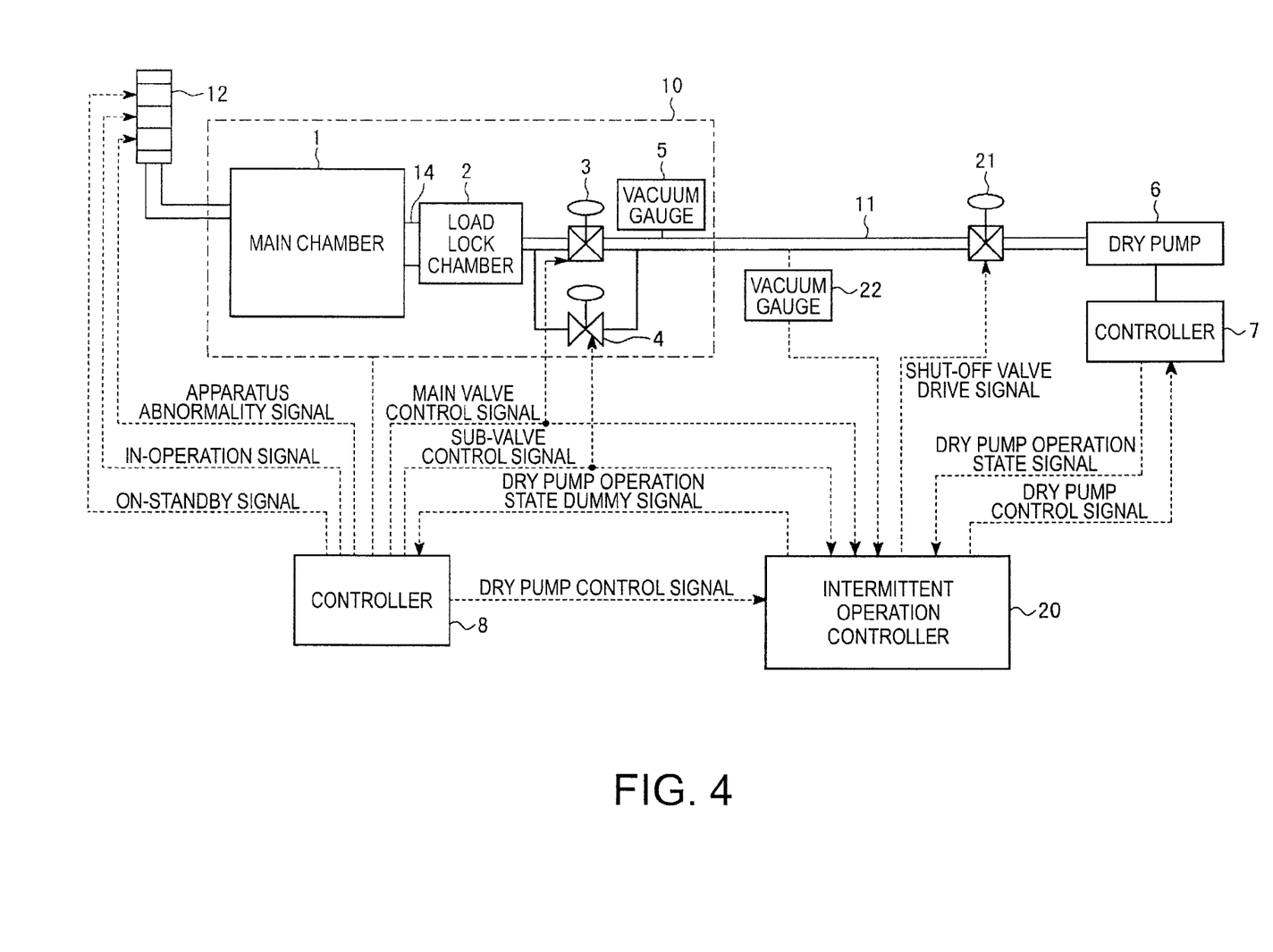
FIG. 4 is a diagram showing a configuration of a semiconductor manufacturing system according to a second embodiment of the invention.

FIG. 4 is a diagram showing a configuration of a semiconductor manufacturing system according to a second embodiment of the invention. The semiconductor manufacturing system according to this embodiment is similar to that according to the first embodiment except that none of an on-standby signal and an in-operation signal is outputted to the intermittent operation controller 20 and, instead, control signals outputted to the main valve 3 and the sub-valve 4 by the controller 8 are outputted to the intermittent operation controller 20 and that the intermittent operation controller 20 determines whether or not the semiconductor manufacturing apparatus 10 is on standby, according to the control signals outputted to the main valve 3 and the sub-valve 4. Hereafter, components identical to those of the first embodiment are given identical reference numerals and will not be described.

Figure 5:
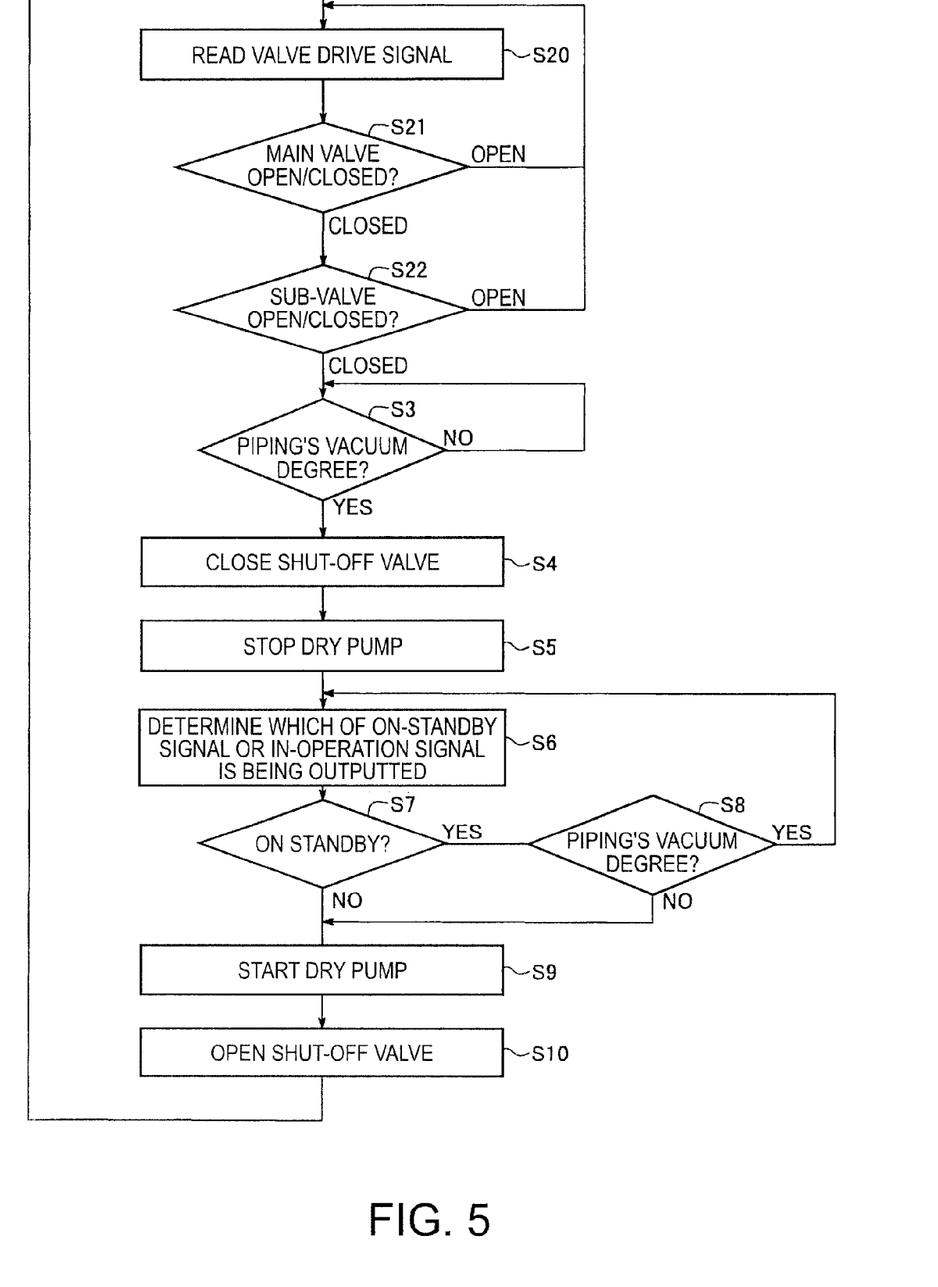
FIG. 5 is a flowchart showing control performed by the intermittent operation controller 20.

FIG. 5 is a flowchart showing control performed by the intermittent operation controller 20 in the semiconductor manufacturing system shown in FIG. 4. First, the intermittent operation controller 20 reads control signals outputted to the main valve 3 and the sub-valve 4 (S20). If the main valve 3 is closed (S21: YES) and the sub-valve 4 is also closed (S22: YES), the intermittent operation controller 20 confirms that a value measured by the vacuum gauge 22, that is, the degree of vacuum of the vacuum piping 11 is equal to or lower than a reference value (S3: YES), and then closes the shut-off valve 21 and then stops the dry pump 6 (S5). Later operations are identical to those described with reference to FIG. 3 in the first embodiment, so those operations are given identical step numbers and will not be described.

Also according to this embodiment, an advantage similar to that of the first embodiment is obtained.

Figure 6:
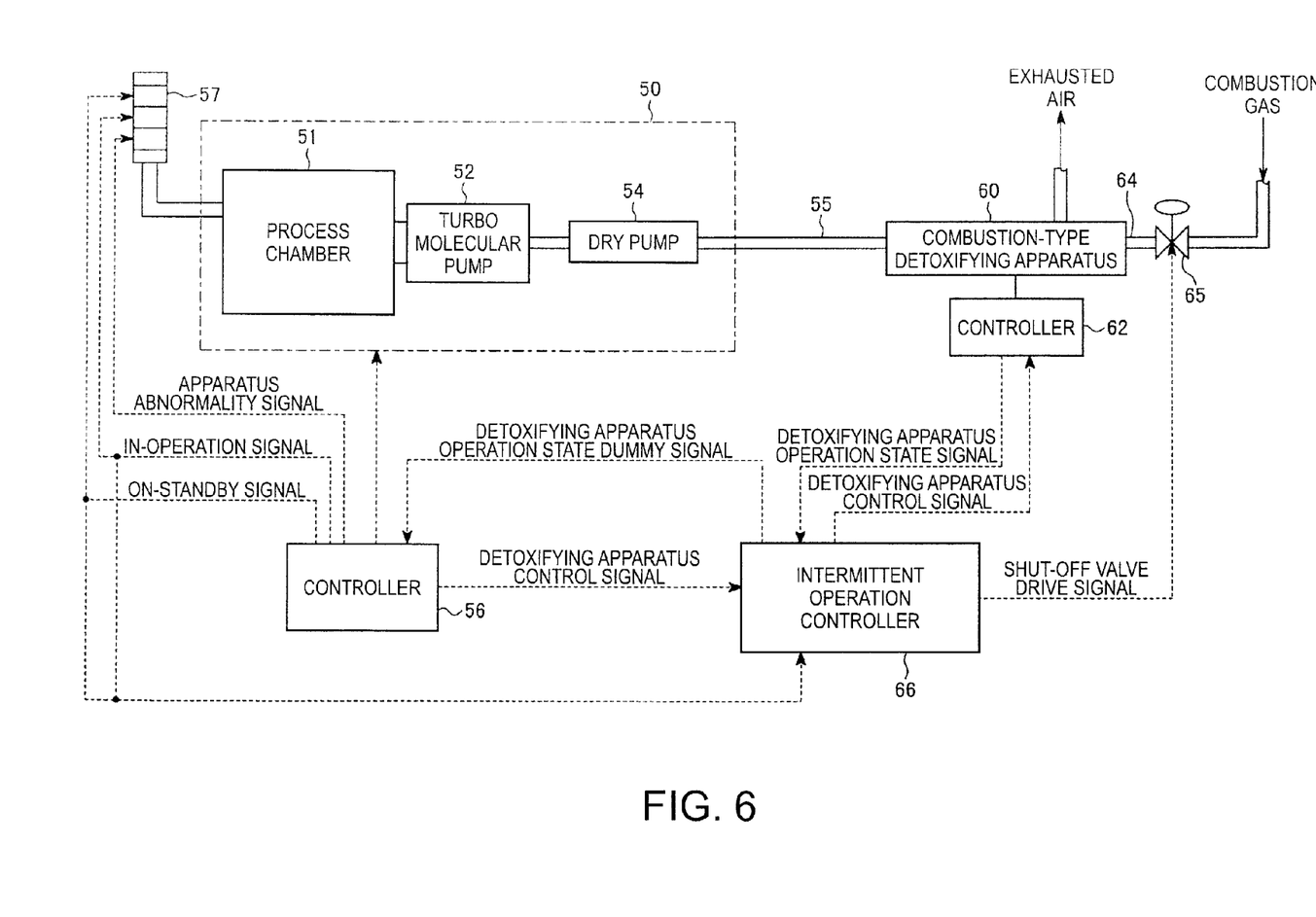
FIG. 6 is a diagram showing a configuration of a semiconductor manufacturing system according to a third embodiment of the invention.

FIG. 6 is a diagram showing a configuration of a semiconductor manufacturing system according to a third embodiment of the invention. This semiconductor manufacturing system includes a semiconductor manufacturing apparatus 50, a controller 56, a combustion-type detoxifying apparatus 60, a controller 62, a display 57, and an intermittent operation controller 66. The intermittent operation controller 66 couples the controllers 56 and 62. The semiconductor manufacturing system shown in this diagram is realized, for example, by adding the intermittent operation controller 66 to the related art semiconductor manufacturing system shown in FIG. 12.

The semiconductor manufacturing apparatus 50 includes a main chamber 51 for processing a semiconductor substrate using a processing gas, and a turbo molecular pump 52 and a dry pump 54 that are sequentially coupled to the main chamber 51. Air exhausted from the dry pump 54 is introduced into the combustion-type detoxifying apparatus 60 via piping 55 and then burned therein together with a combustion gas introduced via piping 64 so as to be detoxified. Thereafter, the detoxified air is discharged to outside.

The controller 56 controls the semiconductor manufacturing apparatus 50. The controller 56 also outputs a detoxifying apparatus control signal for driving or stopping the combustion-type detoxifying apparatus 60 to the intermittent operation control apparatus 60 and receives a detoxifying apparatus operation state dummy signal from the intermittent operation controller 66. If the detoxifying apparatus drive state dummy signal indicates that the combustion-type detoxifying apparatus 60 is operating, the controller 56 puts the semiconductor manufacturing apparatus 50 into operation or on standby, as well as outputs an on-standby signal or an in-operation signal to a display 57 and the intermittent operation controller 66.

If the drip pump drive state dummy signal indicates that the combustion-type detoxifying apparatus 60 is stopping, the controller 56 moves to emergency mode and transmits an apparatus abnormality signal to the display 57 so as to prevent the semiconductor manufacturing apparatus 50 from operating.

According to the received signal, the display 57 indicates that the semiconductor manufacturing apparatus 50 is on standby, in operation, or under an abnormal condition.

The controller 62 controls the combustion-type detoxifying apparatus 60. The controller 62 also outputs a detoxifying apparatus operation state signal indicating whether or not the combustion-type detoxifying apparatus 60 is operating, to the intermittent operation controller 66. Further, the controller 62 puts the combustion-type detoxifying apparatus 60 into operation or on standby according to a detoxifying apparatus control signal outputted from the intermittent operation controller 66.

The intermittent operation controller 66 opens or closes the shut-off valve 65 provided on the piping 64. The intermittent operation controller 66 receives an on-standby signal or an in-operation signal and a detoxifying apparatus control signal from the controller 56 for the semiconductor manufacturing apparatus 50, and a detoxifying apparatus operation state signal from the controller 62 for the combustion-type detoxifying apparatus 60. The intermittent operation controller 66 also outputs a detoxifying apparatus drive signal to the controller 62 and a detoxifying apparatus operation state dummy signal to the controller 56. The detoxifying apparatus operation state dummy signal is similar to a detoxifying apparatus operation state signal except for a case to be discussed later.

If the controller 56 is outputting an on-standby signal, the intermittent operation controller 20 changes a detoxifying apparatus control signal to be outputted to the controller 62, to that for stopping the combustion-type detoxifying apparatus 60 even if a detoxifying apparatus control signal received from the controller 56 is that for operating the combustion-type detoxifying apparatus 60. Thus, the detoxifying apparatus operation state signal comes to indicate that the combustion-type detoxifying apparatus 60 is stopping, while the intermittent operation controller 66 outputs a detoxifying apparatus operation state dummy signal indicating that the combustion-type detoxifying apparatus 60 is operating, to the controller 56.

Figure 7:
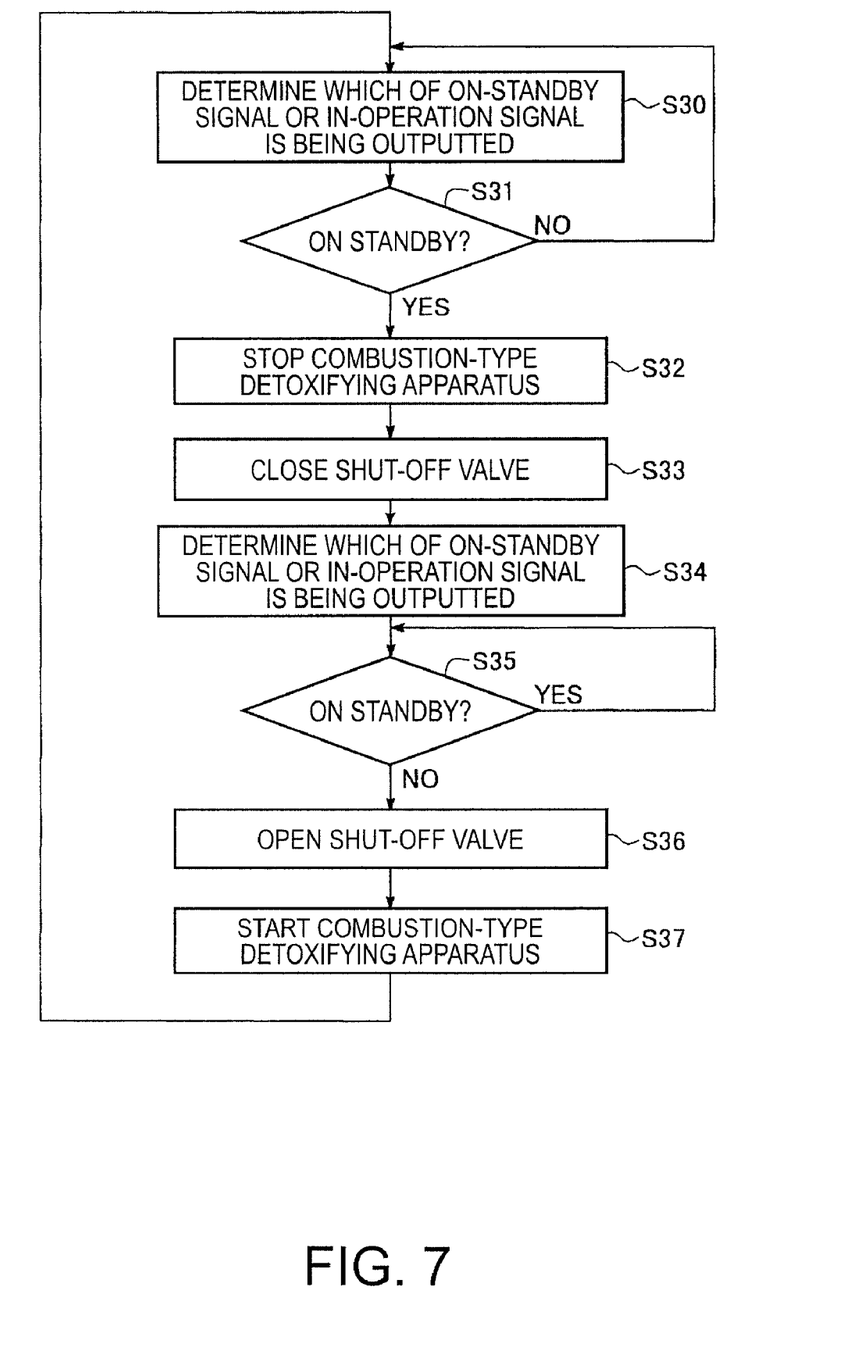
FIG. 7 is a flowchart showing control performed by an intermittent operation controller 66.

FIG. 7 is a flowchart showing control performed by the intermittent operation controller 66. First, the intermittent operation controller 66 determines which of an in-operation signal and an on-standby signal is being outputted from the controller 56 (S30). If an on-standby signal is being outputted, that is, if the semiconductor manufacturing apparatus 50 is on standby (S31: YES), the intermittent operation controller 66 stops the combustion-type detoxifying apparatus 60 (S32) and then closes the shut-off valve 65 (S33).

Subsequently, the intermittent operation controller 66 continues to determine which of an in-operation signal and an on-standby signal is being outputted from the controller 56 (S34). If the on-standby signal is changed to an in-operation signal (S35: NO), the intermittent operation controller 65 opens the shut-off valve 65 (S36) and then starts the combustion-type detoxifying apparatus 60 (S37).

As described above, according to the third embodiment, the controller 56 for the semiconductor manufacturing apparatus 50 and the controller 62 for the combustion-type detoxifying apparatus 60 as an auxiliary machine are electrically coupled via the intermittent operation controller 66. If the semiconductor manufacturing apparatus 50 is on standby, the intermittent operation controller 66 changes a detoxifying apparatus control signal to that for stopping the combustion-type detoxifying apparatus 60 even if the detoxifying apparatus control signal outputted from the controller 56 is that for operating the combustion-type detoxifying apparatus 60, and outputs the changed signal to the controller 62. Thus, the detoxifying apparatus operation state signal outputted from the controller 62 comes to indicate that the combustion-type detoxifying apparatus 60 is stopping, while the intermittent operation controller 66 outputs a detoxifying apparatus operation state dummy signal indicating that the combustion-type detoxifying apparatus 60 is operating, to the controller 56.

As a result, even if no modification is made to the controllers 56 and 62, the combustion-type detoxifying apparatus 60 is stopped for energy saving purposes when the semiconductor manufacturing apparatus 50 is on standby.

Figure 8:
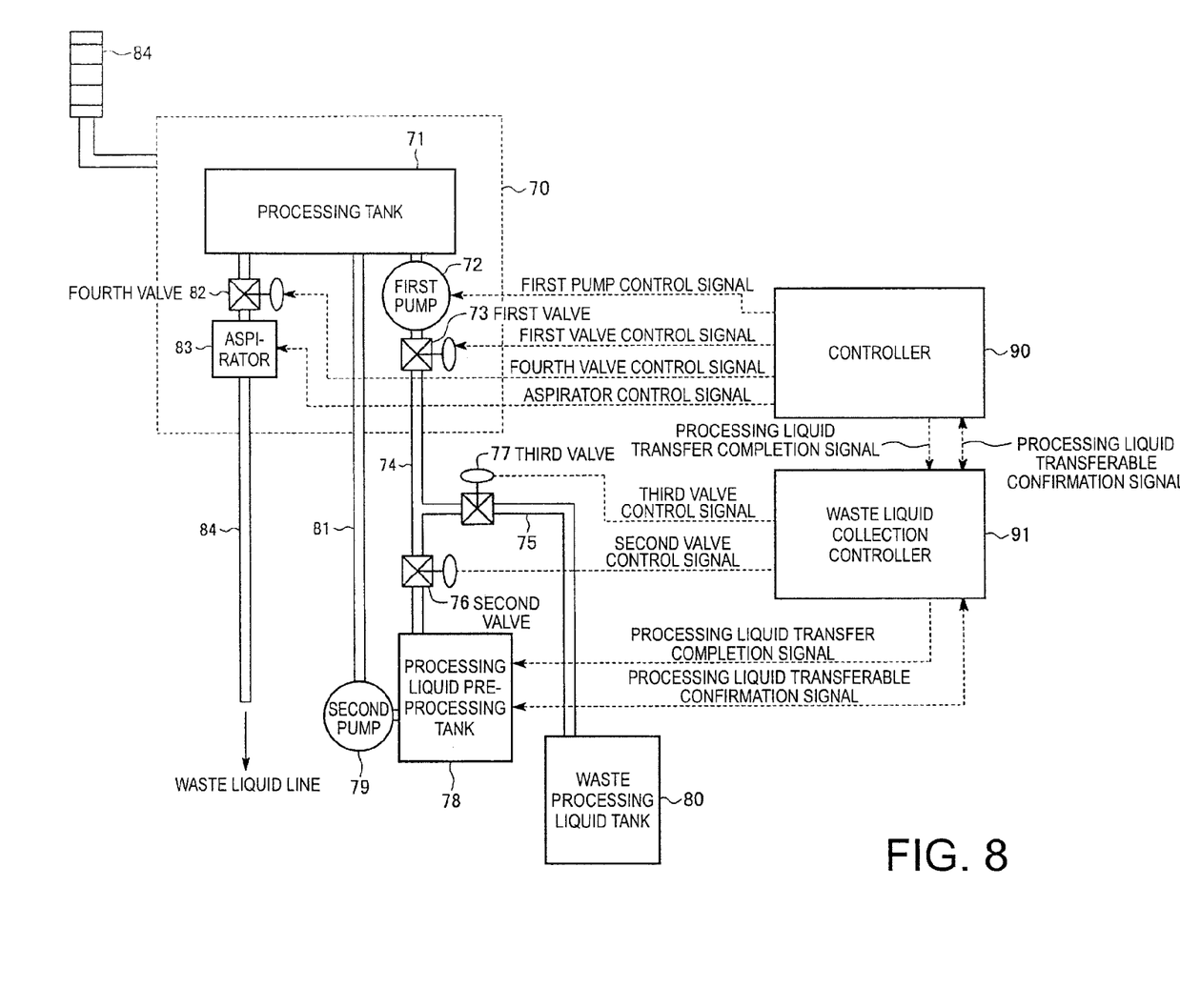
FIG. 8 is a diagram showing a configuration of a semiconductor manufacturing system according to a fourth embodiment of the invention.

FIG. 8 is a diagram showing a configuration of a semiconductor manufacturing system according to a fourth embodiment of the invention. The semiconductor manufacturing system shown in this diagram is a system for processing a semiconductor substrate using a processing liquid contained in a processing tank 71, and is realized, for example, by adding a waste liquid collection controller 91, piping 75, a second valve 76, a third valve 77, and a waste processing liquid tank 80 to the related art semiconductor manufacturing system shown in FIG. 13.

The processing liquid contained in the processing tank 71 is used to process a given amount of substrates and then transferred to the processing liquid preprocessing tank 78 via the piping 74. The processing liquid is subjected to heating and ingredient preparation (hereafter referred to as "preprocessing") in the processing liquid preprocessing tank 78 and then returned to the processing tank 71 via the piping 81. The processing liquid preprocessed by a given number of times is collected into the waste processing liquid tank 80 via the piping 74 and 75.

A first pump 72, a first valve 73, piping 75, and a second valve 76 are mounted on the piping 74 sequentially from upstream. A second pump 79 is mounted on piping 81. The first pump 72 transfers the processing liquid in the processing tank 71 to the processing liquid preprocessing tank 78 or the waste processing liquid tank 80, while the second pump 79 returns the processing liquid in the processing liquid preprocessing tank 78 to the processing tank 71.

Also, piping 84 for discarding the processing liquid in the processing tank 71 into a waste liquid line is mounted on the processing tank 71. Mounted on the piping 84 are a fourth valve 82 and an aspirator 83 for diluting a processing liquid.

The first pump 72, the first valve 73, the fourth valve 82, and the aspirator 83 are controlled by a controller 90, while the second valve 76 and the third valve 77 are controlled by a waste liquid collection controller 91.

The controller 90 opens the first valve 73 to operate the first pump 72, provided that it has received a processing liquid transferable confirmation signal indicating that the processing liquid preprocessing tank 78 is ready to receive a processing liquid. The controller 90 also outputs a signal for requesting a processing liquid transferable confirmation signal, to the processing liquid preprocessing tank 78 via the waste liquid collection controller 91.

The waste liquid collection controller 91 outputs the signal for requesting a processing liquid transferable confirmation signal to the processing liquid preprocessing tank 78 and then receives a processing liquid transferable confirmation signal from the processing liquid preprocessing tank 78. While the waste liquid collection controller 91 outputs the received processing liquid transferable confirmation signal to the controller 90, it also outputs a processing liquid transferable confirmation signal to the controller 90 as necessary when it has received no such signal.

Figure 9:
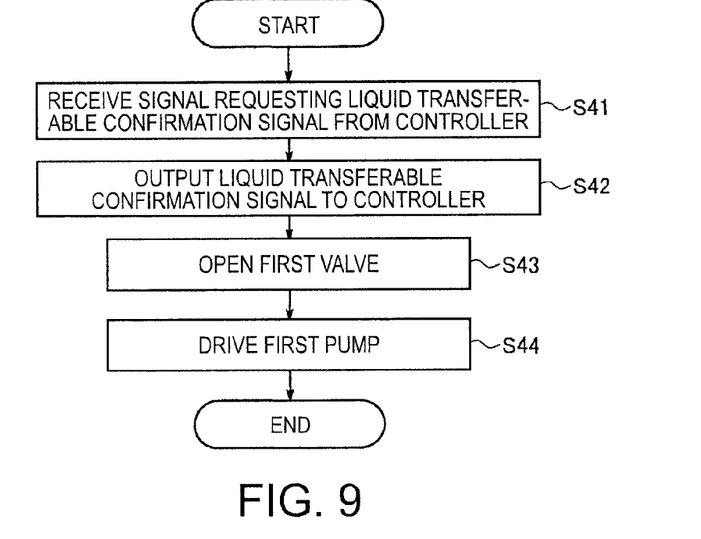
FIG. 9 is a flowchart showing operations performed when a processing liquid in a processing tank 71 is transferred to a processing liquid preprocessing tank 78.

FIG. 9 is a flowchart showing operations performed when the processing liquid in the processing tank 71 is transferred to the processing liquid preprocessing tank 78, among operations of the semiconductor manufacturing system shown in FIG. 8. In a normal state, the waste liquid collection controller 99 keeps the third valve 77 closed and the second valve 76 open.

First, the controller 90 outputs a signal for requesting a processing liquid transferable confirmation signal to the waste liquid collection controller 91. Upon receipt of the signal for requesting a processing liquid transferable confirmation signal from the controller 90 (S41), the waste liquid collection controller 91 outputs the received signal to the processing liquid preprocessing tank 78. Then, upon receipt of a processing liquid transferable confirmation signal from the processing liquid preprocessing tank 78, the waste liquid collection controller 91 outputs the received signal to the controller 90 (S42). Upon receipt of the processing liquid transferable confirmation signal, the controller 90 opens the first valve 73 (S43) and then operates the first pump 72 (S44). Thus, the processing liquid in the processing tank 71 is transferred to the processing liquid preprocessing tank 78.

Figure 10:
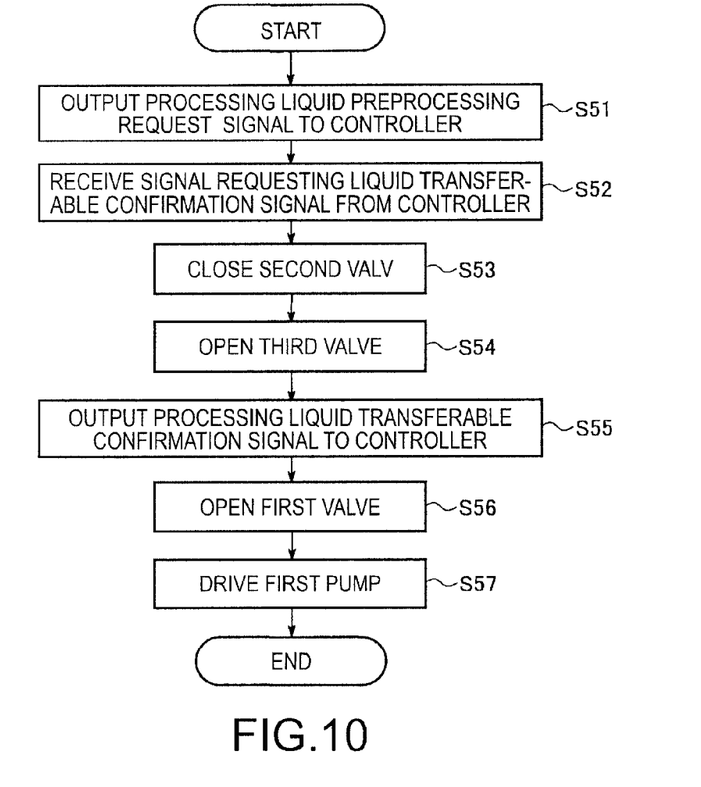
FIG. 10 is a flowchart showing operations performed when a processing liquid in the processing tank 71 is transferred to a waste processing liquid tank 80.

FIG. 10 is a flowchart showing operations performed when the processing liquid in the processing tank 71 is transferred to the waste processing liquid tank 80, among the operations of the semiconductor manufacturing system shown in FIG. 8. The waste liquid collection controller 91 outputs a signal (a processing liquid preprocessing request signal) for performing the operations to be performed when the processing liquid in the processing tank 71 is transferred to the processing liquid preprocessing tank 78 (S51). Then, the controller 90 outputs a signal for requesting a processing liquid transferable confirmation signal to the waste liquid collection controller 91.

Upon receipt of the signal requesting a processing liquid transferable confirmation signal from the controller 90 (S52), the waste liquid collection controller 91 closes the second valve 76 (S53) and opens the third valve 77 (S54). Then the waste liquid collection controller 91 outputs a processing liquid transferable confirmation signal to the controller 90 (S55). Upon receipt of the processing liquid transferable confirmation signal, the controller 90 opens the first valve 73 (S56) and then operates the first pump 72 (S57). Thus, the processing liquid in the processing tank 71 is transferred to the waste processing liquid tank 80 via the piping 74 and 75.

As described above, according to the fourth embodiment, the processing liquid that has become a waste liquid is collected into the waste processing liquid tank 80 without being diluted even if the inside of the controller 90 is not changed.

The invention is not limited to the above-mentioned embodiments and various changes and modifications can be made thereto without departing from the spirit and scope of the invention.

What is claimed is:

1. A semiconductor manufacturing system comprising: a processing tank containing a processing liquid for processing a semiconductor substrate; a preprocessing tank preprocessing the processing liquid; first piping transferring the processing liquid contained in the processing tank to the preprocessing tank; second piping returning the processing liquid preprocessed in the preprocessing tank to the processing tank; a first valve provided on the first piping; a waste liquid tank collecting the processing liquid that has become a waste liquid; a second valve provided downstream of the first valve on the first piping; third piping coupling a portion of the first piping in a position between the first and second valves and the waste liquid tank; a third valve provided on the third piping; a first control unit opening the first valve in preprocessing tank introduction mode in which the processing liquid contained in the processing tank is introduced into the preprocessing tank; and a second control unit controlling the second and third valves, wherein if the processing liquid contained in the processing tank is collected into the waste liquid tank, the second control unit closes the second valve and opens the third valve, and outputs, to the first control unit, a preprocessing tank introduction shift signal for instructing a shift to the preprocessing tank introduction mode; and upon receipt of the preprocessing tank introduction shift signal from the second control unit, the first control unit opens the first valve.

2. A controller used in a semiconductor manufacturing system comprising:
 a processing tank containing a processing liquid for processing a semiconductor substrate;
 a preprocessing tank preprocessing the processing liquid;
 first piping transferring the processing liquid contained in the processing tank to the preprocessing tank;
 second piping returning the processing liquid preprocessed in the preprocessing tank to the processing tank;
 a first valve provided on the first piping;
 a waste liquid tank collecting the processing liquid that has become a waste liquid;
 a second valve provided downstream of the first valve on the first piping;
 third piping coupling a portion of the first piping in a position between the first and second valves and the waste liquid tank;
 a third valve provided on the third piping; and
 a control unit opening the first valve in preprocessing tank introduction mode in which the processing liquid contained in the processing tank is introduced into the preprocessing tank;
 the controller controlling the second and third valves, wherein
 if the processing liquid contained in the processing tank is collected into the waste liquid tank, the controller closes the second valve and opens the third valve, and outputs, to the control unit, a preprocessing tank introduction shift signal for instructing a shift to the preprocessing tank introduction mode.

3. A processing liquid collection method for collecting a processing liquid that has become a waste liquid, from a semiconductor manufacturing system, the system comprising;
 a processing tank containing the processing liquid for processing a semiconductor substrate;
 a preprocessing tank preprocessing the processing liquid;
 first piping introducing the processing liquid contained in the processing tank into the preprocessing tank;
 second piping returning the processing liquid preprocessed in the preprocessing tank to the processing tank;
 a first valve provided on the first piping; and
 a control unit opening the first valve if the control unit receives a preprocessing tank introduction shift signal for instructing introduction of the processing liquid contained in the processing tank into the preprocessing tank;
 the method comprising:
 providing a second valve downstream of the first valve on the first piping;
 coupling a waste liquid tank for collecting the processing liquid that has become a waste liquid, and a portion of the first piping in a position between the first and second valves using third piping;
 providing a third valve on the third piping; and
 controlling the second and third valves using a controller, wherein
 if the processing liquid contained in the processing tank is collected into the waste liquid tank, closing the second valve and opening the third valve, and then outputting the preprocessing tank introduction shift signal to the control unit so as to open the first valve.

* * * * *